(12) United States Patent
Dauvergne et al.

(10) Patent No.: US 6,659,423 B1
(45) Date of Patent: Dec. 9, 2003

(54) DEVICE FOR CONTROLLING AN ACTUATOR IN PARTICULAR FOR A VEHICLE

(75) Inventors: Jean Dauvergne, Trappes (FR); Didier Barat, Meudon (FR); Andrew Nash, Clairfontaine (FR)

(73) Assignees: Valeo, Paris (FR); Visteon Systemes Interieurs, La Defense Cedex (FR)

(*) Notice: Subject to any disclaimer, the term of this patent is extended or adjusted under 35 U.S.C. 154(b) by 0 days.

(21) Appl. No.: 10/019,503
(22) PCT Filed: Jun. 30, 2000
(86) PCT No.: PCT/FR00/01844
§ 371 (c)(1), (2), (4) Date: May 30, 2002
(87) PCT Pub. No.: WO01/02200
PCT Pub. Date: Jan. 11, 2001

(30) Foreign Application Priority Data

Jun. 30, 1999 (FR) .............................................. 99 08732

(51) Int. Cl.⁷ .......................... F16K 31/00; H01R 12/00
(52) U.S. Cl. .................... 251/129.11; 165/43; 361/627; 439/55
(58) Field of Search ............................. 236/51; 361/807, 361/627; 251/129.11; 454/75; 165/43; 439/55

(56) References Cited

U.S. PATENT DOCUMENTS

| | | | |
|---|---|---|---|
| 5,424,586 A | 6/1995 | Hattori et al. ............... 257/306 |
| 5,623,170 A | * 4/1997 | Bartel ........................ 307/10.2 |
| 5,820,020 A | 10/1998 | Sunaga et al. ............. 236/49.3 |
| 5,958,556 A | * 9/1999 | McCutcheon ................ 428/172 |
| 6,028,384 A | * 2/2000 | Billman et al. ................ 310/83 |

FOREIGN PATENT DOCUMENTS

| DE | 42 25 358 | 2/1994 | ............ H05K/3/32 |
|---|---|---|---|
| EP | 0 769 398 | 4/1997 | ............ B60H/1/00 |

* cited by examiner

Primary Examiner—William Wayner
(74) Attorney, Agent, or Firm—Young & Thompson

(57) ABSTRACT

A device for controlling actuator includes a monitor for monitoring (1) the actuators (2) and a set of conductors (3,9) connected to the monitoring (1). The device includes a single physical support (5) for at least part of the monitoring (1) and the conductors (3,9).

20 Claims, 2 Drawing Sheets

DEVICE FOR CONTROLLING AN ACTUATOR IN PARTICULAR FOR A VEHICLE

FIELD OF THE INVENTION

The invention relates to an actuator control device and a heating, ventilating and/or air-conditioning device, especially for a vehicle, comprising such a control device.

BACKGROUND OF THE INVENTION

However, although more particularly intended for such applications, it could also be used in all the sectors of economic activity in which there is a need to control actuators.

Currently, in the field of heating, ventilation and/or air-conditioning, it is known to use flaps and/or fans making it possible to adjust the temperature and/or the throughput of an airflow. The movements of these items are controlled by actuators such as electric-motor and step-down gear assemblies. The operation of these assemblies is determined on the basis of a power-supply voltage the level of which is made variable. To do that, drive means are used, which make it possible to adjust the voltage as a function of set-point values and/or of values originating from sensors via feedback loops.

Another mode of operation of these actuators is based on controls of the "stepper" type, and the drive means then drive by successive pulses, the number of which is determined by a computer in response to set-point values and/or values from sensors via feedback loops.

At the present time, the wiring between these various components is taken from point to point, and it can be imagined that such a solution requires a large number of cables, which complicates their assembly and increases their cost.

In particular, it requires a large number of different anchor points to be provided for each of the cables and it entails a multiplication of the connections to be formed.

The reliability of the corresponding circuits remains inadequate, moreover.

SUMMARY OF THE INVENTION

The object of the present invention is to propose an actuator control device and a heating, ventilating and/or air-conditioning device, especially for a vehicle, comprising such a control device which overcome the above-mentioned drawbacks and the wiring of which is simplified.

Another object of the present invention is to propose an actuator control device and a heating, ventilating and/or air-conditioning device, especially for a vehicle, which are ready to fit during assembly.

Other objects and advantages of the invention will emerge in the course of the description which will follow, which is given only by way of indication and is not for the purpose of limiting it.

The invention relates to an actuator control device comprising means for driving the said actuators and a set of conductors linked to the said drive means, characterised in that the said device comprises a single means for physical support of at least some of the said drive means and of the said conductors.

The invention also relates to a heating, ventilating and/or air-conditioning device, especially for a vehicle, comprising such a control device.

BRIEF DESCRIPTION OF THE DRAWINGS

The invention will be better understood on reading the following description, accompanied by the drawings in the annex which form an integral part of it, and among which.

DESCRIPTION OF THE PREFERRED EMBODIMENTS

Figure 1:
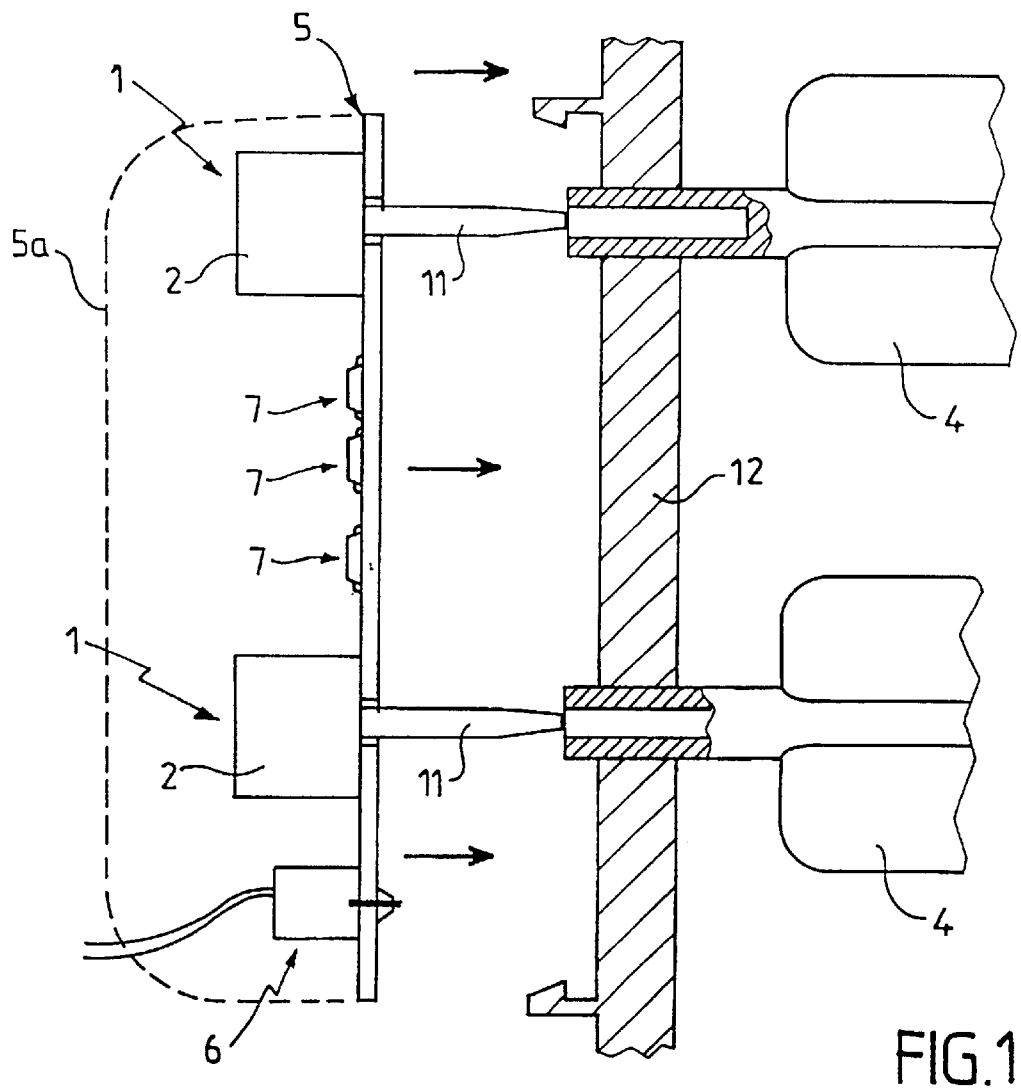
FIG. 1 diagrammatically illustrates, in section, a first example embodiment of the control device in accordance with the invention, FIG. 2 diagrammatically illustrates, in perspective, a second example embodiment of the control device in accordance with the invention, FIG. 3 diagrammatically illustrates, partially and in section, a third example embodiment of the control device in accordance with the invention.
Figure 2:
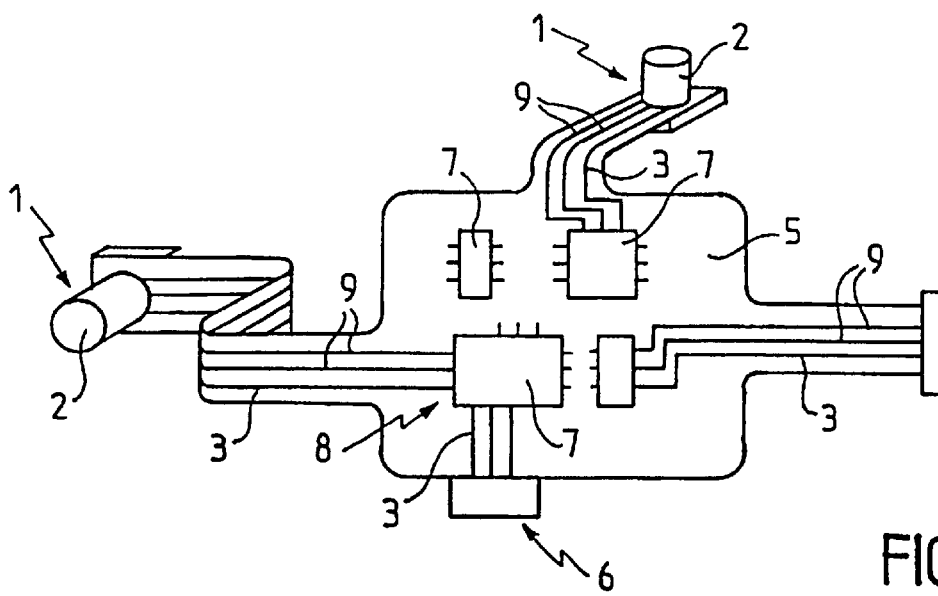

The invention first of all relates to an actuator control device. As illustrated in FIGS. 1 and 2, it comprises means 1 for driving the said actuators 2 and a set of conductors 3, 9, linked to the said drive means 1, especially for distributing information to them.

By "actuators" is understood any member making it possible to convert input energy, especially electrical energy, into mechanical output energy so as to be able to set another member into motion. This therefore covers, for example, an electric motor, possibly combined with step-down gears, which are intended to cause flaps 4 to pivot and/or to cause fans to turn.

The said drive means especially make it possible, from a given voltage, originating, for example, from the battery of a vehicle, to convert the voltage into an output voltage the level of which is variable, especially on the basis of regulation information conveying set-point values and/or values originating from sensors via feedback loops. In the case of "stepper" systems, the voltage will be converted into a series of electrical pulses corresponding to an angular step of the actuator.

By way of example, the said drive means 1 could consist, especially, of changeover switches, of stepper-motor control systems and/or of power-varying devices, such as those with transistors mounted either in ballast mode or in chopper mode.

By "regulation information" is meant information making it possible to influence the mode of operation of the drive means, for example, by determining the level of their output voltage or by determining the number of pulses. This especially covers a current controlling the opening/closing of a changeover switch, the operation of a chopper or others. It could also cover analog information, as well as digital information. The content of it could be determined by processing means to which we will return later on.

According to the invention, the said device comprises a single means 5 for physical support of at least some of the said drive-means 1 and of the said conductors 3.

By thus taking advantage of a single support, the wiring and the anchoring are facilitated. Moreover, the connections between the said drive means and the said conductors can be formed beforehand; it is possible to make available a solution which is ready for use.

The said conductors 3, provided on the said support means 5 define, for example, at least one network on which the said regulation information flows in multiplexed form to the said drive means 1. Such a solution makes it possible further to simplify the wiring since the set-point commands and/or the values originating from the feedback loops no longer have to be routed to each of the drive means 1 involved.

The said information-circulation network is designed to be able, especially, to be connected to the outside, for example to another network, by means of a single connection means 6 provided on the said support means 5.

In order to route the multiplexed regulation information to the drive means 1 involved, the network in accordance with the invention further comprises routing means 7, provided, for example, on the said support means 5. They particularly allow the information to circulate on the said conductors 3 of the network, either in ring mode or in star mode, or in stages or otherwise, by virtue of different electronic nodes. The latter are integrated into the said drive means 1, the said connection means 6 or other means, as appropriate.

According to a first embodiment, the regulation information is determined by external processing means and is forwarded, ready to be acted on by the said drive means 1, to the said network of the control device in accordance with the invention, especially by way of the said connection means 6, the role of the said network then being mainly to carry out the routing.

According to another embodiment, the said processing means, identified as 8, are provided at the level of the said network of the control device. The input information for the said processing means, such as set-point levels and/or values originating from feedback loops, could then be supplied to the control device in accordance with the invention either in multiplexed form, or point to point, especially at the level of the said connection means 6. According to such an embodiment, all or some of the said routing means are integrated into the said processing means 8. The latter are provided on the said support means 5, for example.

That being so, the said conductors 9 provided on the said support means 5 could also make it possible, cumulatively or alternatively, to supply power to all or some of the said drive means 1.

In the case of an actuator requiring high power, the conductors for supplying power to it are provided separately, if appropriate.

The single said connection means 6 could, moreover, be designed to be able to make it possible to link the said power-supply conductors 9 to an external power-supply source.

As illustrated in FIG. 2, each drive means 1 is connected, for example, to two said power-supply conductors 9 and to one said multiplexed conductor 3 of the said network; originating directly or otherwise from the said connection means 6 and/or from the said processing means 8. They are, in particular, arranged parallel to one another.

As regards the said power-supply conductors 9, they are mounted, for example, branched off from the said connection means 6.

The said support means 5 consists, for example, of a printed circuit, the tracks of which define the said conductors 3, 9 of the control device in accordance with the invention.

According to a first embodiment, illustrated in FIG. 1, the said printed circuit is rigid. The support means 5 and the elements which are fixed to it are then mounted in the same plane, if appropriate.

According to another embodiment, illustrated in FIG. 2, the said printed circuit is designed to be flexible. It is then stiffened locally, if appropriate, in the region of the location of the said drive means and/or actuators 2 which, as explained later, could also be fixed to the said support means 5.

Figure 3:
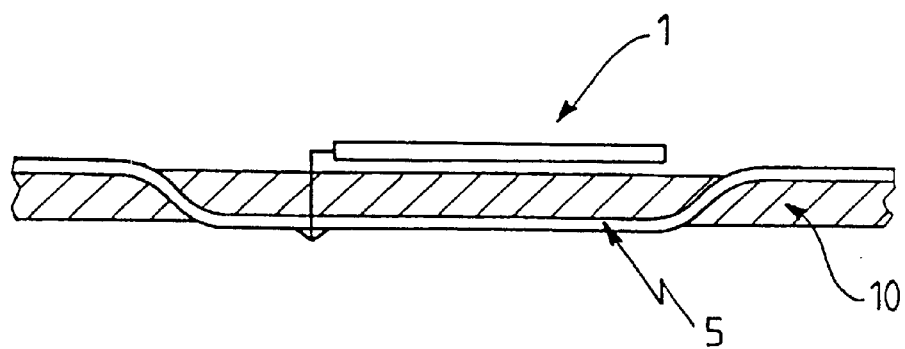
Figure 4:
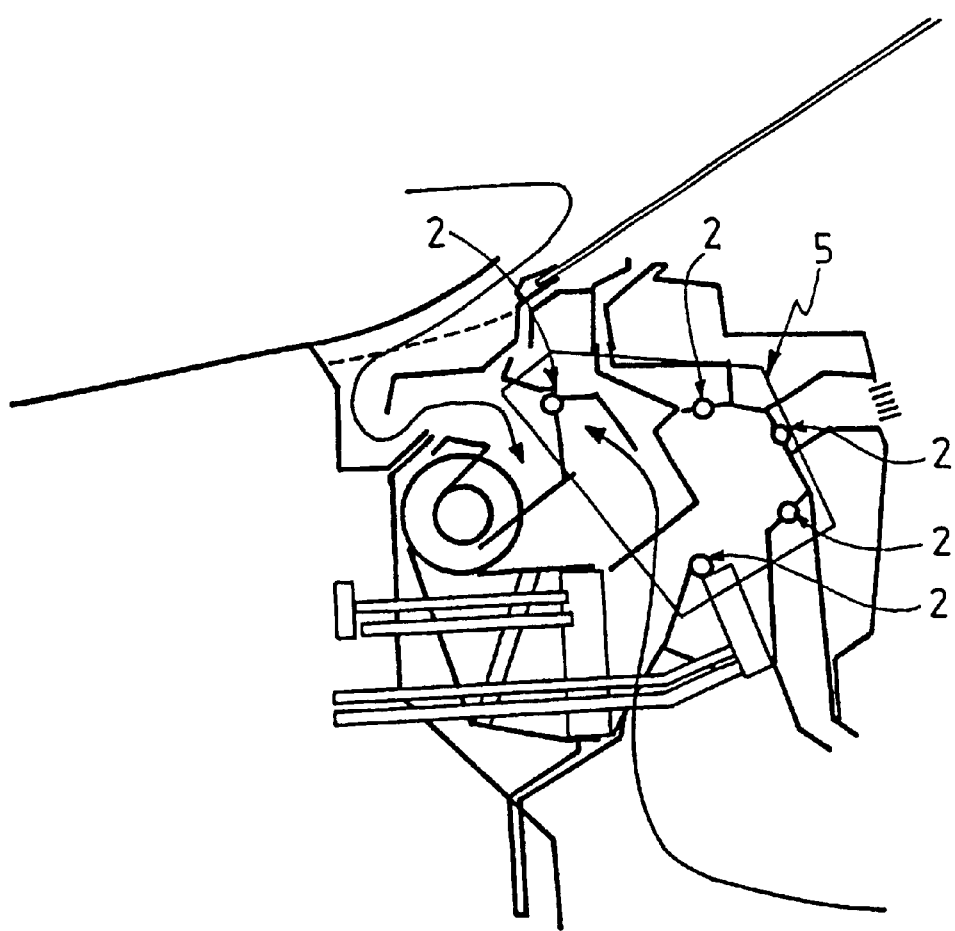
FIG. 4 illustrates, in cross section, an example embodiment of the heating, ventilating and/or air-conditioning device in accordance with the invention.

According to another embodiment, illustrated in FIG. 3, the said printed circuit is designed to be flexible and is partially overmoulded onto a support 10, especially of plastic, in such a way as to leave the extremities of the said circuit, which are intended for connection, partially free. The connection of the said drive means 1 and of the said printed circuit is formed through the said support 10. Thus an essentially rigid solution is made available.

As already stated, the said support means 5, if appropriate, furthermore accommodates the said actuators 2 themselves. To do that, the said printed circuit or the said support 10 supports the said actuators 2, which are designed to be fixed to this support in the vicinity of their drive means 1.

More precisely, the said printed circuit supports the step-down gears and/or the motors constituting the said actuators.

According to a first embodiment, the step-down gears of the actuators are mounted on the rigid parts, printed circuit 5 or support 10, such that the individual casings usually used for the actuators are no longer necessary. A single casing 5a can act as protection.

According to another embodiment, the motors of the actuators are connected directly to the printed circuit, which is designed to be at least partially flexible, by soldering or otherwise.

The invention also relates to a heating, ventilating and/or air-conditioning device, especially for a vehicle, comprising such a control device.

The said heating, ventilating and/or air-conditioning device 4 comprises, for example, a fan, a radiator and/or an evaporator between which the air to be treated flows in ducts between one or more air inlets and one or more air outlets.

Flaps 4 serve to route the air between the various ducts so as, especially, to modulate the quantity and/or the origin of the air to be treated or else the temperature and/or the output direction of the treated air.

The fan, the radiator and/or the evaporator are arranged relatively with respect to one another in such a way that the air, while it is being treated, follows a trajectory winding around a longitudinal axis of the dashboard for which the said heating, ventilating and/or air-conditioning device is intended.

As illustrated in FIG. 1, the components 4, especially articulated flaps, are provided in the region of a support fixture 12. The said control device, designed to be rigid, is then designed to be able, if appropriate, to be clipped onto the said fixture 12, facing at least one part of the said components 4. The motors arranged on the said support means 5 and/or their actuating spindles 11 could be designed to pass through the said support means 5, the step-down gears possibly associated with them then being provided face-to-face on a support fixture 12 for the actuated member or members 4.

The actuating spindles 11 of the said motors 2 and/or the articulation spindles of the flaps, which extend them, are, for example, substantially parallel to each other and orthogonal to the said support fixture 5.

Other elements could be supported by the printed circuit 5 if appropriate, such as certain sensors for example (temperature probe). They could be connected to the conductors 3 of the network.

Naturally, other embodiments within the scope of the person skilled in the art could have been envisaged without to any extent departing from the context of the invention.

What is claimed is:

1. A vehicle heating, ventilating, and air-conditioning device, comprising:
   plural air ducts;
   articulated flaps serving to route air in the plural air ducts;
   actuators operatively connected to the articulated flaps for controlling the flaps;
   an actuator control device comprising
      drive means (1) for driving the actuators (2),
      a set of conductors (3, 9) linked to the drive means, and
      a single support means (5) for physical support of at least some of the drive means (1) and of the conductors (3, 9); and
      a fixture (12) supporting the actuator control device and the articulated flaps.

2. Device according to claim 1, in which the conductors (3) provided on the support means (5) define at least one network in which regulation information flows in a multiplexed form to the drive means (1).

3. Device according to claim 2, in which the information-circulation network is designed to be able to be connected to the outside by a single connection means (6) provided on the support means (5).

4. Device according to claim 2, in which the network further comprises processing means (8) for establishing regulation information to be circulated on the network, on the basis of input signals.

5. Device according to claim 3, in which at least some of the conductors (9) provided on the support means (5) make it possible to supply power to all or some of the drive means (1).

6. Device according to claim 5, in which the single connection means (6) is moreover designed to be able to make it possible to link the supply conductors (9) to an external power-supply source or to another network.

7. Device according to claim 5, in which each drive means (1) is connected to two said power-supply conductors (9) and to one conductor of the network, originating, directly or otherwise, from the connection means (6) or from the processing means (8).

8. Device according to claim 1, in which the support means (5) comprises a printed circuit, stiffened locally in the region of the location of the drive means (1) or of the actuators (2).

9. Device according to claim 8, in which the printed circuit furthermore supports the actuators (2), which are designed to be fixed to this circuit in the vicinity of their drive means (1).

10. Device according to claim 1, in which the flaps feature articulation spindles which are substantially parallel to each other and orthogonal to the support fixture.

11. Heating, ventilating, and air-conditioning device, for a vehicle, comprising:
    various air ducts;
    an actuator control device for controlling actuators which are configured for actuating articulated flaps serving to route air in the various ducts;
    said actuator control device comprising
       drive means (1) for driving the actuators (2),
       a set of conductors (3, 9) linked to the drive means, and
       a single support means (5) for physical support of at least some of the drive means (1) and of the conductors (3, 9); and
       a fixture which is designed to be able to support the actuator control device and the flaps.

12. Device according to claim 11, in which the conductors (3) provided on the support means (5) define at least one network in which regulation information flows in a multiplexed form to the drive means (1).

13. Device according to claim 12, in which the information-circulation network is designed to be able to be connected to the outside by a single connection means (6) provided on the support means (5).

14. Device according to claim 13, in which the network further comprises processing means (8) for establishing regulation information to be circulated on the network, on the basis of input signals.

15. Device according to claim 14, in which at least some of the conductors (9) provided on the support means (5) make it possible to supply power to all or some of the drive means (1).

16. Device according to claim 15, in which the single connection means (6) is moreover designed to be able to make it possible to link the supply conductors (9) to an external power-supply source or to another network.

17. Device according to claim 15, in which each drive means (1) is connected to two power-supply conductors (9) and to one conductor of the network, originating, directly or otherwise, from the connection means (6) or from the processing means (8).

18. Device according to claim 11, in which the support means (5) comprises a printed circuit, stiffened locally in the region of the location of the drive means (1) or of the actuators (2).

19. Device according to claim 18, in which the printed circuit furthermore supports the actuators (2), which are designed to be fixed to this circuit in the vicinity of their drive means (1).

20. Device according to claim 11, in which the flaps feature articulation spindles which are substantially parallel to each other and orthogonal to the support fixture.

* * * * *